United States Patent
Min

(10) Patent No.: US 8,524,093 B2
(45) Date of Patent: Sep. 3, 2013

(54) METHOD FOR FORMING A DEEP TRENCH

(75) Inventor: Chung-Chiang Min, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 1001 days.

(21) Appl. No.: 11/953,887

(22) Filed: Dec. 11, 2007

(65) Prior Publication Data

US 2009/0001050 A1    Jan. 1, 2009

(30) Foreign Application Priority Data

Jun. 29, 2007 (TW) .............................. 96123809 A

(51) Int. Cl.
- *C23F 1/00* (2006.01)
- *B44C 1/22* (2006.01)
- *H01L 21/302* (2006.01)

(52) U.S. Cl.
USPC .................. 216/17; 216/41; 216/46; 216/51; 216/57; 438/689; 438/694; 438/710

(58) Field of Classification Search
USPC .................. 216/51, 41, 46, 57; 438/243, 386
See application file for complete search history.

(56) References Cited

U.S. PATENT DOCUMENTS

| | | | | |
|---|---|---|---|---|
| 5,482,883 A * | 1/1996 | Rajeevakumar | ............... | 438/249 |
| 6,716,696 B2 * | 4/2004 | Chen et al. | ............... | 438/243 |
| 6,967,136 B2 | 11/2005 | Akatsu et al. | | |
| 2005/0026382 A1 * | 2/2005 | Akatsu et al. | ............... | 438/386 |
| 2005/0145913 A1 * | 7/2005 | Katsumata et al. | ............... | 257/301 |
| 2005/0158945 A1 * | 7/2005 | Birner et al. | ............... | 438/243 |
| 2005/0250345 A1 * | 11/2005 | Sun et al. | ............... | 438/778 |

FOREIGN PATENT DOCUMENTS

| | | |
|---|---|---|
| TW | 200710988 | 3/2007 |
| TW | I278069 | 4/2007 |

* cited by examiner

*Primary Examiner* — Shamim Ahmed
(74) *Attorney, Agent, or Firm* — Winston Hsu; Scott Margo

(57) ABSTRACT

A method for forming a deep trench includes providing a substrate with a bottom layer and a top layer; performing a first etching process to etch the top layer, the bottom layer and the substrate so as to form a recess; selectively depositing a liner covering the top layer, the bottom layer and part of the substrate in the recess; using the liner as an etching mask to perform a second dry etching to etch the recess unmasked by the liner so as to form a deep trench; performing a selective wet etching to remove the top layer; and performing a post wet etching to enlarge the deep trench.

8 Claims, 6 Drawing Sheets

METHOD FOR FORMING A DEEP TRENCH

BACKGROUND OF THE INVENTION

1. Field of the Invention

The present invention relates to a method for forming a deep trench. In particular, the present invention relates to a method for forming a deep trench by using a liner in combination with a selective etching procedure.

2. Description of the Prior Art

In a dynamic random access memory (DRAM), conventionally two types of capacitors are used, and one of them is called a deep trench capacitor. In the process of forming the deep trench capacitor, usually a shallow trench is first formed by dry etching and further the depth is accomplished under the protection of a layer of $SiO_2$. Finally, the surface area is enlarged by wet etching under the protection of a layer of aluminum oxide. Such procedure requires two kinds of etching mask for protection.

Therefore, a novel process is needed for forming the deep trench capacitor with sufficient depth and surface area.

SUMMARY OF THE INVENTION

The present invention provides a method for forming a deep trench, in which only one etching mask is required to complete the etching of the deep trench. Not only is the process simplified, but also the production cost can be further lowered.

The method for forming the deep trench of the present invention includes:

providing a substrate with a bottom layer and a top layer;

performing a first etching process to etch the top layer, the bottom layer and the substrate so as to form a recess;

selectively depositing a liner covering the top layer, the bottom layer and part of the substrate in the recess;

using the liner as an etching mask to perform a second etching to etch the recess unmasked by the liner so as to form a deep trench;

performing a selective wet etching to remove the top layer; and performing a post wet etching to enlarge the deep trench.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
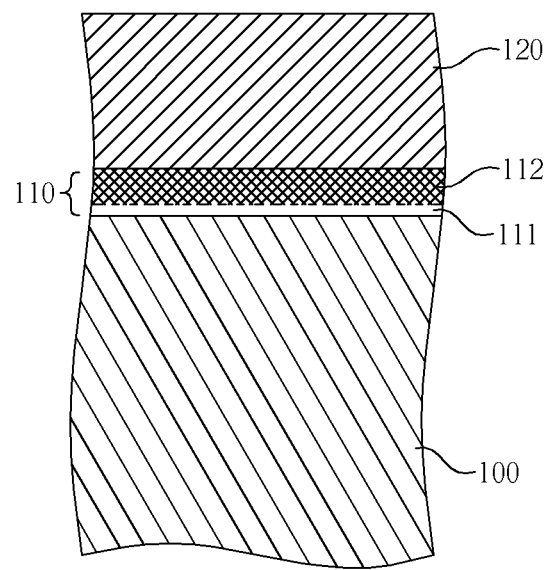
FIG. 1*a* to 1*f* illustrate a preferred embodiment of the method for forming the deep trench of the present invention.

The method for forming the deep trench of the present invention may use only one etching mask to complete the etching of the deep trench by taking advantage of combining the liner and the selective etching, which not only greatly simplifies the procedure but also makes the production cost low. FIG. 1A to 1*f* illustrate a preferred embodiment of the method for forming the deep trench of the present invention. Particularly, the deep trench is used to form a trenched capacitor of a DRAM device. Please refer to FIG. 1A, first a substrate 100 is provided with a pad layer comprising a bottom layer 110 and a top layer 120. The substrate 100 usually includes a semiconductor material, such as Si. The bottom layer 110 and the top layer 120 may be formed on the substrate according to the conventional methods. The bottom layer 110 may preferably include a pad oxide layer 111 with a thickness of 3 nm and a silicon nitride layer 112 with a thickness of 150 nm respectively. The top layer 120 may usually include a silicate glass, such as an undoped silicate glass with a thickness of 2 μm by physical vapor deposition.

Figure 1B:
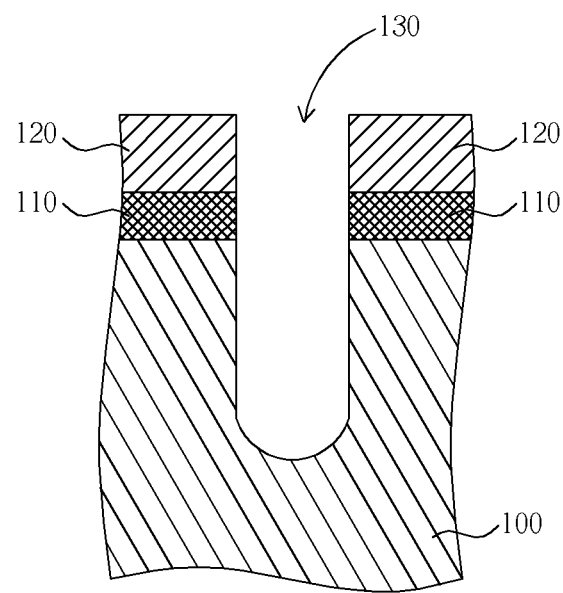

Please refer to FIG. 1B, a first dry etching process is performed, in accordance with a lithographic process, to etch the top layer 120, the bottom layer 110 and the substrate 100 so as to form a preliminary recess 130. For example, the first dry etching process may be carried out by using a mixed gas of $NF_3$ and HBr, and the recess 130 may have a width of about 100 nm and a depth of about 3 μm. The thickness of the top layer 120 may be more or less reduced due to the first dry etching process.

Figure 1C:
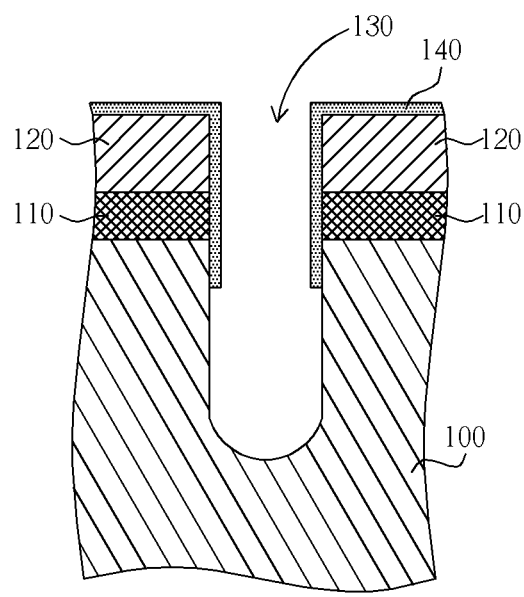

Please refer to FIG. 1C, a liner 140 is selectively deposited to cover the top layer 120, the bottom layer 110 and part of the substrate 100 in the recess to be an etching mask for the following steps. The liner 140 preferably includes an oxide, such as metal oxide, aluminum oxide for example. For instance, the aluminum oxide is made from trimethylaluminun and water may be used as the precursor to form the liner 140, and the atomic layer deposition (ALD) may be used to make the aluminum oxide with a thickness about 10 nm.

Figure 1D:
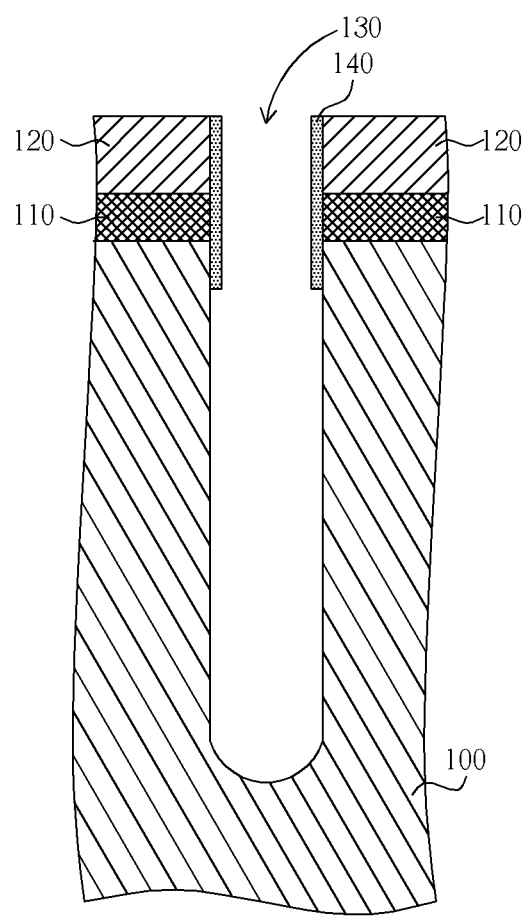

Please refer to FIG. 1D, the liner 140 is used as an etching mask to perform a second dry etching to etch the recess 130 unmasked by the liner so as to form a deep trench 131. For example, a mixed gas of $NF_3+HBr+O_2+SiF_4$ may be used as the etchant to increase the depth to an extent of around 7.4 μm. After the second dry etching, the thickness of the liner 140 may be diminished. Preferably, the second dry etching may entirely remove the liner 140 used as the etching mask.

Figure 1E:
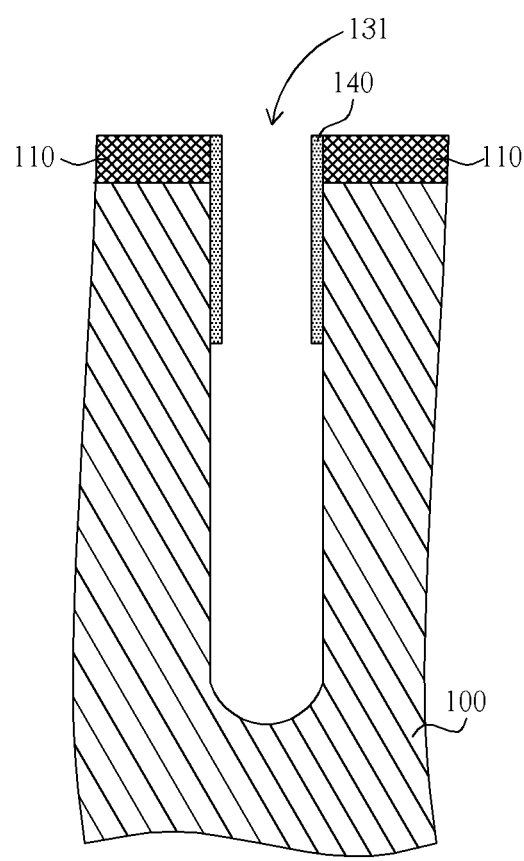

Please refer to FIG. 1E, a selective wet etching is performed to remove the top layer 120. For example, a fluoride may be used to carry out the selective wet etching for about 60 seconds. The fluoride may preferably be HF gas, such as HF gas mixed with water vapor to carry out the selective wet etching for about 60 seconds. In another preferable embodiment, the top layer 120 is retained until the deep trench is formed.

Figure 1F:
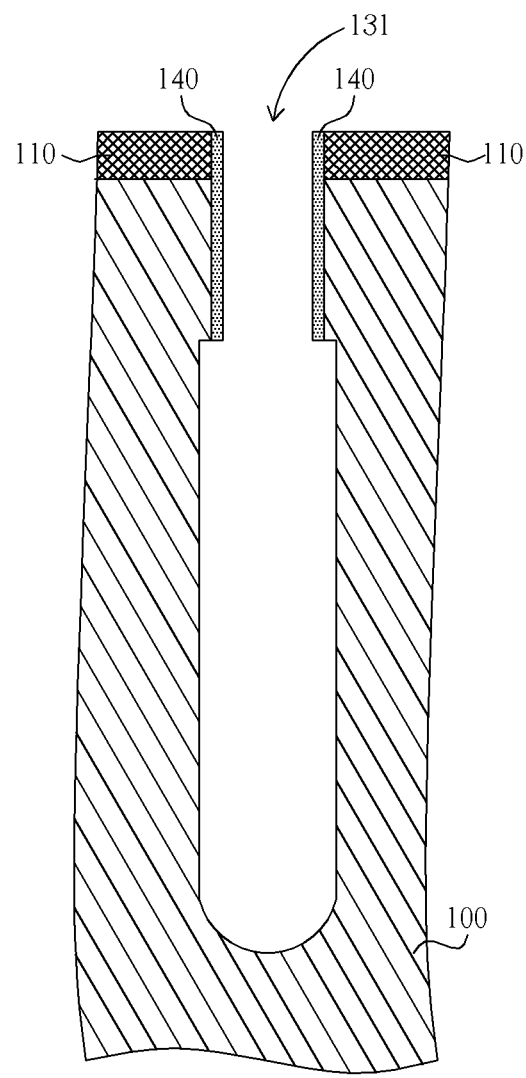

Please refer to FIG. 1F, a post wet etching is performed to enlarge the deep trench 131, and the liner 140 is served as an etching mask in this step. For example, first a 31% hydrogen peroxide solution mixed with aqueous ammonia, then a 49% dilute HF solution and later an aqueous ammonia may be used to increase the width of the deep trench 131 to about 150 nm. Preferably a bottle-shaped profile may be accordingly formed. Now the deep trench of the present invention is completed.

Optionally, the liner 140 on the inner wall of the deep trench 131 may be further removed. For example, a hot phosphoric acid of concentration 85% and a temperature of 160° C. may be used to strip the remaining liner 140 on the inner wall of the deep trench 131.

Because the method for forming the deep trench of the present invention uses the combination effect of the liner plus the selective etching, merely one etching mask is required to complete the etching of the deep trench. Not only is the manufacturing process is much easier, the obtained deep trench also has sufficient depth and surface area, which is suitable for the semiconductor process of smaller and smaller critical dimension.

Those skilled in the art will readily observe that numerous modifications and alterations of the device and method may be made while retaining the teachings of the invention.

What is claimed is:

1. A method for forming a deep trench, comprising the steps of:
providing a substrate having a pad layer formed on a top face of the substrate, wherein the pad layer comprises a first layer of a combination of oxide and nitride and a second layer of silicate glass, and the second layer is on a top surface of the first layer;
performing a first etching process to form a first trench through the pad layer and into the substrate, wherein the first trench includes a sidewall and a bottom surface;
after the first etching process, forming a liner to cover a top surface of the pad layer and the sidewall of the first trench, wherein the liner does not cover the bottom surface of the first trench, and wherein the sidewall of the first trench is aligned with an edge of the pad layer and an edge of the second layer;
after forming the liner, performing a second etching process to etch the bottom surface of the first trench to form a second trench by using the liner on the pad layer as an etching hard mask; and
after forming the second trench, enlarging a bottom portion of the second trench.

2. The method as claimed in claim 1, wherein the first trench defining step is a dry etching.

3. The method as claimed in claim 2, wherein the liner is formed by atomic layer deposition (ALD).

4. The method as claimed in claim 3, wherein the liner is aluminum oxide.

5. The method as claimed in claim 1, wherein the second trench enlarging step comprises using the liner as a hard mask to etch the bottom portion of the second trench.

6. The method as claimed in claim 4, wherein the second trench enlarging step comprises using the liner as a hard mask to etch the bottom portion of the second trench.

7. The method as claimed in claim 5, wherein an etchant used for the second trench enlarging step is selected from the group consisting of hydrogen peroxide, aqueous ammonia and HF.

8. The method as claimed in claim 6, wherein an etchant used for the second trench enlarging step is selected from the group consisting of hydrogen peroxide, aqueous ammonia and HF.

* * * * *